United States Patent
Do et al.

(10) Patent No.: US 8,148,768 B2
(45) Date of Patent: Apr. 3, 2012

(54) NON-VOLATILE MEMORY CELL WITH SELF ALIGNED FLOATING AND ERASE GATES, AND METHOD OF MAKING SAME

(75) Inventors: Nhan Do, Saratoga, CA (US); Amitay Levi, Cupertino, CA (US)

(73) Assignee: Silicon Storage Technology, Inc., Sunnyvale, CA (US)

(*) Notice: Subject to any disclaimer, the term of this patent is extended or adjusted under 35 U.S.C. 154(b) by 566 days.

(21) Appl. No.: 12/324,816

(22) Filed: Nov. 26, 2008

(65) Prior Publication Data

US 2010/0127308 A1    May 27, 2010

(51) Int. Cl.
*H01L 29/788* (2006.01)

(52) U.S. Cl. ..... 257/315; 257/204; 257/316; 257/E29.3; 257/E21.422; 438/588

(58) Field of Classification Search .......... 257/315, 257/204, 316, E21.422; 438/588
See application file for complete search history.

(56) References Cited

U.S. PATENT DOCUMENTS

| | | | |
|---|---|---|---|
| 4,757,360 A | 7/1988 | Farone | |
| 4,794,565 A | 12/1988 | Wu et al. | |
| 4,882,707 A | 11/1989 | Mizutani | |
| 4,905,062 A | 2/1990 | Esquivel et al. | |
| 4,931,847 A | 6/1990 | Corda | |
| 4,947,221 A | 8/1990 | Stewart et al. | |
| 5,021,848 A | 6/1991 | Chiu | |
| 5,029,130 A | 7/1991 | Yeh | |
| 5,041,886 A | 8/1991 | Lee | |
| 5,049,515 A | 9/1991 | Tzeng | |
| 5,101,250 A | 3/1992 | Arima et al. | |
| 5,268,319 A | 12/1993 | Harari | |
| 5,338,953 A | 8/1994 | Wake | |
| 5,381,028 A | 1/1995 | Iwasa | |
| 5,429,965 A | 7/1995 | Shimoji | |
| 5,495,441 A | 2/1996 | Hong | |
| 5,544,103 A | 8/1996 | Lambertson | |

(Continued)

FOREIGN PATENT DOCUMENTS

EP    0 389 721 A2    10/1990

OTHER PUBLICATIONS

U.S. Appl. No. 10/358,601, filed Feb. 2003, Kianian.

(Continued)

*Primary Examiner* — Jerome Jackson, Jr.
*Assistant Examiner* — Dale E Page
(74) *Attorney, Agent, or Firm* — DLA Piper LLP (US)

(57) ABSTRACT

A memory device, and method of making the same, in which a trench is formed into a substrate of semiconductor material. The source region is formed under the trench, and the channel region between the source and drain regions includes a first portion that extends substantially along a sidewall of the trench and a second portion that extends substantially along the surface of the substrate. The floating gate is disposed in the trench, and is insulated from the channel region first portion for controlling its conductivity. The control gate is disposed over and insulated from the channel region second portion, for controlling its conductivity. The erase gate is disposed at least partially over and insulated from the floating gate. The erase gate includes a notch, and the floating gate includes an edge that directly faces and is insulated from the notch.

8 Claims, 5 Drawing Sheets

U.S. PATENT DOCUMENTS

| | | | |
|---|---|---|---|
| 5,572,054 | A | 11/1996 | Wang et al. |
| 5,638,320 | A | 6/1997 | Wong et al. |
| 5,780,341 | A | 7/1998 | Ogura |
| 5,780,892 | A | 7/1998 | Chen |
| 5,789,293 | A | 8/1998 | Cho et al. |
| 5,796,139 | A | 8/1998 | Fukase |
| 5,808,328 | A | 9/1998 | Nishizawa |
| 5,811,853 | A | 9/1998 | Wang |
| 5,814,853 | A | 9/1998 | Chen |
| 5,943,572 | A | 8/1999 | Krautschneider |
| 6,091,104 | A | 7/2000 | Chen |
| 6,103,573 | A | 8/2000 | Harari et al. |
| 6,140,182 | A | 10/2000 | Chen |
| 6,157,058 | A | 12/2000 | Ogura |
| 6,180,458 | B1 | 1/2001 | Krautschneider et al. |
| 6,222,227 | B1 | 4/2001 | Chen |
| 6,262,917 | B1 | 7/2001 | Lee |
| 6,316,298 | B1 | 11/2001 | Lee |
| 6,316,315 | B1 | 11/2001 | Hofmann et al. |
| 6,521,944 | B1 | 2/2003 | Mirgorodski |
| 6,525,371 | B2 | 2/2003 | Johnson |
| 6,538,275 | B2 | 3/2003 | Sugiyama et al. |
| 6,541,815 | B1 | 4/2003 | Mandelman et al. |
| 6,756,633 | B2 | 6/2004 | Wang et al. |
| 6,891,220 | B2 | 5/2005 | Yeh et al. |
| 6,906,379 | B2 * | 6/2005 | Chen et al. ............ 257/315 |
| 6,952,034 | B2 | 10/2005 | Hu et al. |
| 7,326,614 | B2 | 2/2008 | Kianian |
| 7,411,246 | B2 | 8/2008 | Kianian |
| 2003/0073275 | A1 | 4/2003 | Kianian et al. |
| 2005/0104115 | A1 * | 5/2005 | Kianian ............ 257/314 |
| 2005/0269624 | A1 | 12/2005 | Hu et al. |

OTHER PUBLICATIONS

U.S. Appl. No. 10/358,623, filed Feb. 2003, Hu et al.
U.S. Appl. No. 10/653,015, filed Aug. 2003, Chen et al.
Hayashi, Fumihiko and Plummer, James D., "A Self-Aligned Split-Gate Flash EEPROM Cell With 3-D Pillar Structure," 1999 Symposium on VLSI Technology Digest of Technical Papers, Center for Integrated System, Stanford University, Stanford, CA 94305, USA, pp. 87-88.
Sze, Simon, "Physics of Semiconductor Devices," 2nd Edition, Wiley-Interscience, Basic Device Characteristics, pp. 438-439.
Brown, William D. et al, "Nonvolatile Semiconductor Memory Technology, A Comprehensive Guide to Understanding and Using NVSM Devices," IEEE Press., pp. 33-34.

* cited by examiner

NON-VOLATILE MEMORY CELL WITH SELF ALIGNED FLOATING AND ERASE GATES, AND METHOD OF MAKING SAME

TECHNICAL FIELD

The present invention relates to a self-aligned method of forming a semiconductor memory array of floating gate memory cells. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

There is a constant need to shrink the size of the memory cell arrays in order to maximize the number of memory cells on a single wafer, while not sacrificing performance (i.e. program, erase and read efficiencies and reliabilities). It is well known that forming memory cells in pairs, with each pair sharing a single source region, and with adjacent pairs of cells sharing a common drain region, reduces the size of the memory cell array. It is also known to form trenches into the substrate, and locate one or more memory cell elements in the trench to increase the number of memory cells that fit into a given unit surface area (see for example U.S. Pat. Nos. 5,780,341 and 6,891,220). However, such memory cells use the control gate to both control the channel region (in a low voltage operation) and to erase the floating gate (in a high voltage operation). This means the control gate is both a low voltage and high voltage element, making it difficult to surround it with sufficient insulation for high voltage operation while not being too electrically isolated for low voltage operation. Moreover, the proximity of the control gate to the floating gate needed for an erase operation can result in unwanted levels of capacitive coupling between the control gate and the floating gate.

Thus it is an object of the present invention to create a memory cell configuration and method of manufacture where the memory cell elements are self aligned to each other, and that improved programming, erase and read efficiencies are achieved.

SUMMARY OF THE INVENTION

The aforementioned problems, needs and objects are addressed by the memory devices and methods disclosed herein.

An electrically programmable and erasable memory device includes a substrate of semiconductor material having a first conductivity type and a surface, a trench formed into the surface of the substrate, first and second spaced-apart regions formed in the substrate and having a second conductivity type, with a channel region in the substrate there between, wherein the first region is formed under the trench, and the channel region includes a first portion that extends substantially along a sidewall of the trench and a second portion that extends substantially along the surface of the substrate, an electrically conductive floating gate at least partially disposed in the trench adjacent to and insulated from the channel region first portion for controlling a conductivity of the channel region first portion, an electrically conductive control gate disposed over and insulated from the channel region second portion for controlling a conductivity of the channel region second portion, and an electrically conductive erase gate disposed adjacent to and insulated from the floating gate.

An array of electrically programmable and erasable memory devices includes a substrate of semiconductor material having a first conductivity type and a surface, spaced apart isolation regions formed on the substrate which are substantially parallel to one another and extend in a first direction, with an active region between each pair of adjacent isolation regions, and each of the active regions including a plurality of pairs of memory cells. Each of the memory cell pairs includes a trench formed into the surface of the substrate and including a pair of opposing sidewalls, a first region formed in the substrate under the trench, a pair of second regions formed in the substrate, with a pair of channel regions each in the substrate between the first region and one of the second regions, wherein the first and second regions have a second conductivity type, and wherein each of the channel regions includes a first portion that extends substantially along one of the opposing trench sidewalls and a second portion that extends substantially along the substrate surface, a pair of electrically conductive floating gates each at least partially disposed in the trench adjacent to and insulated from one of the channel region first portions for controlling a conductivity of the one channel region first portion, an electrically conductive erase gate disposed adjacent to and insulated from the floating gates, and a pair of electrically conductive control gates each disposed over and insulated from one of the channel region second portions for controlling a conductivity of the one channel region second portion.

A method of forming a semiconductor memory cell that includes forming a trench into a surface of a semiconductor substrate, wherein the substrate has a first conductivity type, forming first and second spaced-apart regions of a second conductivity type in the substrate with the first region formed under the trench, wherein a channel region is in the substrate between the first and second regions such that the channel region includes a first portion that extends substantially along a sidewall of the trench and a second portion that extends substantially along the surface of the substrate, forming an electrically conductive floating gate at least partially disposed in the trench adjacent to and insulated from the channel region first portion for controlling a conductivity of the channel region first portion, forming an electrically conductive control gate disposed over and insulated from the channel region second portion for controlling a conductivity of the channel region second portion, and forming an electrically conductive erase gate disposed adjacent to and insulated from the floating gate.

A method of forming an array of electrically programmable and erasable memory devices includes forming spaced apart isolation regions on a semiconductor substrate that are substantially parallel to one another and extend in a first direction, with an active region between each pair of adjacent isolation regions, wherein the substrate has a surface and a first conductivity type, and forming a plurality of pairs of memory cells in each of the active regions. The formation of each of the memory cell pairs includes forming a trench into the surface of the substrate having a pair of opposing sidewalls, forming a first region in the substrate and under the trench, forming a pair of second regions in the substrate, with a pair of channel regions each defined in the substrate between the first region and one of the second regions, wherein the first and second regions have a second conductivity type, and wherein each of the channel regions includes a first portion that extends substantially along one of the opposing trench sidewalls and a second portion that extends substantially along the surface of the substrate, forming a pair of electrically conductive floating gates each at least partially disposed in the trench adjacent to and insulated from one of the channel region first portions for controlling a conductivity of the one channel region first portion, forming an electrically conductive erase gate disposed adjacent to and insulated from the floating gates, and forming a pair of electrically conductive control gates each disposed over and insulated from one of the channel region second portions for controlling a conductivity of the one channel region second portion.

Other objects and features of the present invention will become apparent by a review of the specification, claims and appended figures.

DETAILED DESCRIPTION OF THE PREFERRED EMBODIMENTS

The method of the present invention is illustrated in FIGS. 1A to 1F and 2A to 2F (which show the processing steps in making the memory cell array of the present invention). The method begins with a semiconductor substrate 10, which is preferably of P type and is well known in the art. The thicknesses of the layers described below will depend upon the design rules and the process technology generation. What is described herein is for the 0.09 um micron process. However, it will be understood by those skilled in the art that the present invention is not limited to any specific process technology generation, nor to any specific value in any of the process parameters described hereinafter.

Isolation Region Formation

Figure 1A:
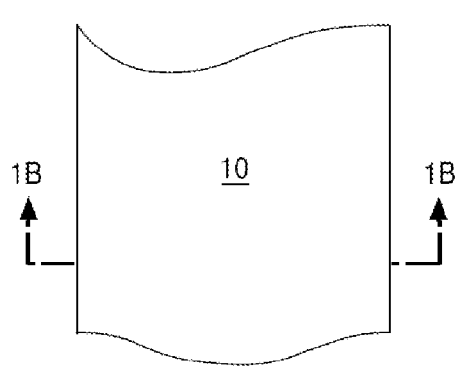
FIG. 1A is a top view of a semiconductor substrate used in the first step of the method of present invention to form isolation regions.
Figure 1B:
FIG. 1B is a cross sectional view of the structure taken along the line 1B-1B showing the initial processing steps of the present invention.

FIGS. 1A to 1F illustrate the well known STI method of forming isolation regions on a substrate. Referring to FIG. 1A there is shown a top plan view of a semiconductor substrate 10 (or a semiconductor well), which is preferably of P type and is well known in the art. First and second layers of material 12 and 14 are formed (e.g. grown or deposited) on the substrate. For example, first layer 12 can be silicon dioxide (hereinafter "oxide"), which is formed on the substrate 10 by any well known technique such as oxidation or oxide deposition (e.g. chemical vapor deposition or CVD) to a thickness of approximately 50-150 Å. Nitrogen doped oxide or other insulation dielectrics can also be used. Second layer 14 can be silicon nitride (hereinafter "nitride"), which is formed over oxide layer 12 preferably by CVD or PECVD to a thickness of approximately 1000-5000 Å. FIG. 1B illustrates a cross-section of the resulting structure.

Figure 1D:
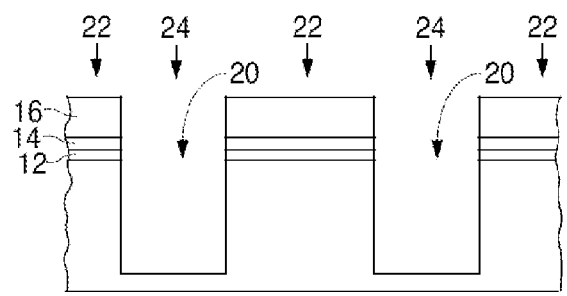
FIG. 1D is a cross sectional view of the structure in FIG. 1C taken along the line 1D-1D showing the isolation trenches formed in the structure.
Figure 1C:
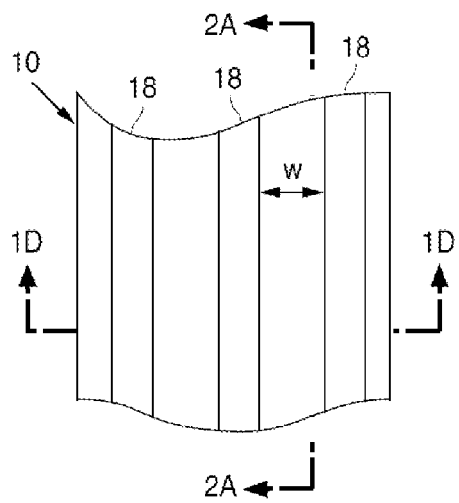
FIG. 1C is a top view of the structure showing the next step in the processing of the structure of FIG. 1B, in which isolation regions are defined.

Once the first and second layers 12/14 have been formed, suitable photo resist material 16 is applied on the nitride layer 14 and a masking step is performed to selectively remove the photo resist material from certain regions (stripes 18) that extend in the Y or column direction, as shown in FIG. 1C. Where the photo-resist material 16 is removed, the exposed nitride layer 14 and oxide layer 12 are etched away in stripes 18 using standard etching techniques (i.e. anisotropic nitride and oxide/dielectric etch processes) to form trenches 20 in the structure. The distance W between adjacent stripes 18 can be as small as the smallest lithographic feature of the process used. A silicon etch process is then used to extend trenches 20 down into the silicon substrate 10 (e.g. to a depth of approximately 500 Å to several microns), as shown in FIG. 1D. Where the photo resist 16 is not removed, the nitride layer 14 and oxide layer 12 are maintained. The resulting structure illustrated in FIG. 1D now defines active regions 22 interlaced with isolation regions 24.

Figure 1E:
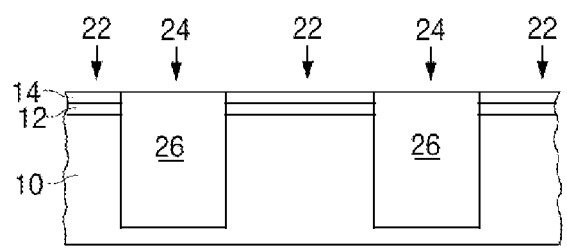
FIG. 1E is a cross sectional view of the structure in FIG. 1D showing the formation of isolation blocks of material in the isolation trenches.

The structure is further processed to remove the remaining photo resist 16. Then, an isolation material such as silicon dioxide is formed in trenches 20 by depositing a thick oxide layer, followed by a Chemical-Mechanical-Polishing or CMP etch (using nitride layer 14 as an etch stop) to remove the oxide layer except for oxide blocks 26 in trenches 20, as shown in FIG. 1E. The remaining nitride and oxide layers 14/12 are then removed using nitride/oxide etch processes, leaving STI oxide blocks 26 extending along isolation regions 24, as shown in FIG. 1F.

The STI isolation method described above is the preferred method of forming isolation regions 24. However, the well known LOCOS isolation method (e.g. recessed LOCOS, poly buffered LOCOS, etc.) could alternately be used, where the trenches 20 may not extend into the substrate, and isolation material maybe formed on the substrate surface in stripe regions 18. FIGS. 1A to 1F illustrate the memory cell array region of the substrate, in which columns of memory cells will be formed in the active regions 22 which are separated by the isolation regions 24. It should be noted that the substrate 10 also includes at least one periphery region (not shown) in which control circuitry is formed that will be used to operate the memory cells formed in the memory cell array region. Preferably, isolation blocks 26 are also formed in the periphery region during the same STI or LOCOS process described above.

Memory Cell Formation

Figure 1F:
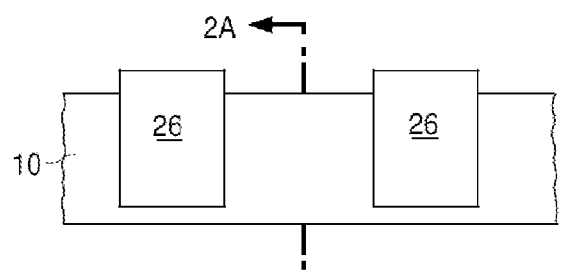
FIG. 1F is a cross sectional view of the structure in FIG. 1E showing the final structure of the isolation regions.

The structure shown in FIG. 1F is further processed as follows. FIGS. 2A to 2F show the cross sections of the structure in the active regions 22 from a view orthogonal to that of FIG. 1F (along line 2A-2A as shown in FIGS. 1C and 1F), as the next steps in the process of the present invention are performed concurrently in both regions.

Figure 2A:
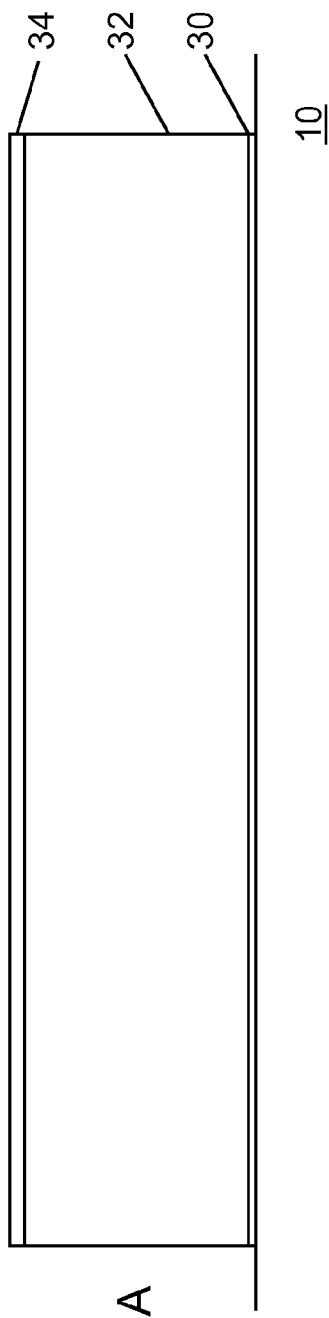
FIGS. 2A-2F are cross sectional views of the semiconductor structure in FIG. 1F taken along the line 2A-2A showing in sequence the steps in the processing of the semiconductor structure in the formation of a non-volatile memory array of floating gate memory cells of the present invention.

An insulation layer 30 (preferably oxide or nitrogen doped oxide) is first formed over the substrate 10. The active region portions of the substrate 10 can be doped at this time for better independent control of the cell array portion of the memory device relative to the periphery region. Such doping is often referred to as a $V_t$ implant or cell well implant, and is well known in the art. During this implant, the periphery region is protected by a photo resist layer, which is deposited over the entire structure and removed from just the memory cell array region of the substrate. Next, a thick layer of hard mask material 32 such as nitride is formed over oxide layer 30 (e.g. ~3500 Å thick). Then, an insulation layer 34 such as oxide is formed over the nitride layer 32. The resulting structure is shown in FIG. 2A.

A plurality of parallel second trenches 36 are formed in the oxide, nitride, oxide layers 34, 32, 30 by applying a photo resist (masking) material on the oxide layer 34, and then performing a masking step to remove the photo resist material from selected parallel stripe regions. Anisotropic oxide, nitride, and oxide etches are used to remove the exposed portions of oxide, nitride and oxide layers 34, 32, 30 in the stripe regions, leaving second trenches 36 that extend down to and expose substrate 10. A silicon anisotropic etch process is then used to extend second trenches 36 down into the substrate 10 in each of the active regions 22 (for example, down to a depth of approximately one feature size deep, e.g. about 500 Å to several microns with 0.09 um technology). Alternately, the photo resist can be removed after trenches 36 are formed into the substrate 10.

Figure 2B:
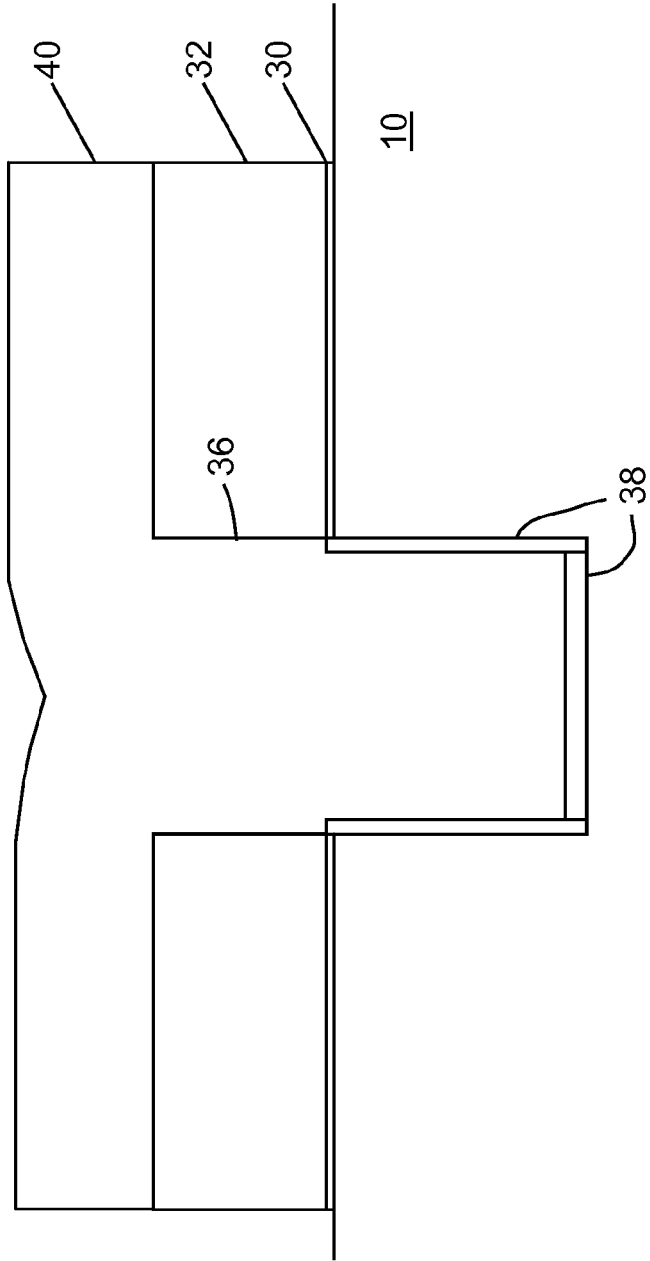

An oxide etch is used to remove oxide layer 34. A layer of insulation material 38 is next formed (preferably using a thermal oxidation or CVD oxide process) along the exposed silicon in second trenches 36 that forms the bottom wall and lower sidewalls of the second trenches 36 (e.g. ~60 Å to 150 Å thick). A thick layer of polysilicon 40 (hereinafter "poly") is then formed over the structure, which fills second trenches 36. Poly layer 40 can be doped (e.g. n+) by ion implant, or by an in-situ doped poly process. The resulting structure is shown in FIG. 2B.

Figure 2C:
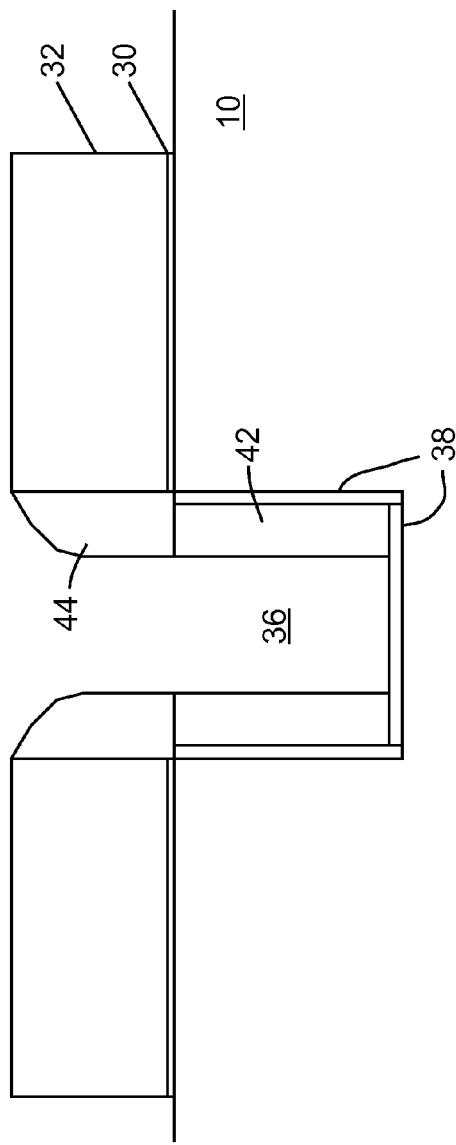

A poly etch process (e.g. a CMP process using nitride layer 32 as an etch stop) is used to remove poly layer 40 except for blocks 42 of the polysilicon layer 40 left remaining in second trenches 36. A controlled poly etch is then used to lower the height of poly blocks 42, where the tops of poly blocks 42 are disposed approximately even with the surface of substrate 10. Oxide spacers 44 are then formed along the sidewalls of the second trenches 36. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). Spacers 44 are formed by depositing oxide over the structure (e.g. approximately 300 to 1000 Å thickness) followed by an anisotropic oxide etch, which results in spacers 44 along the trench sidewalls, and an exposed portion of the poly block 42 there between. An anisotropic poly etch is then used to remove that exposed portion of poly block 42, leaving a pair of poly blocks 42 each located under one of the spacers 44. The resulting structure is shown in FIG. 2C.

Figure 2D:
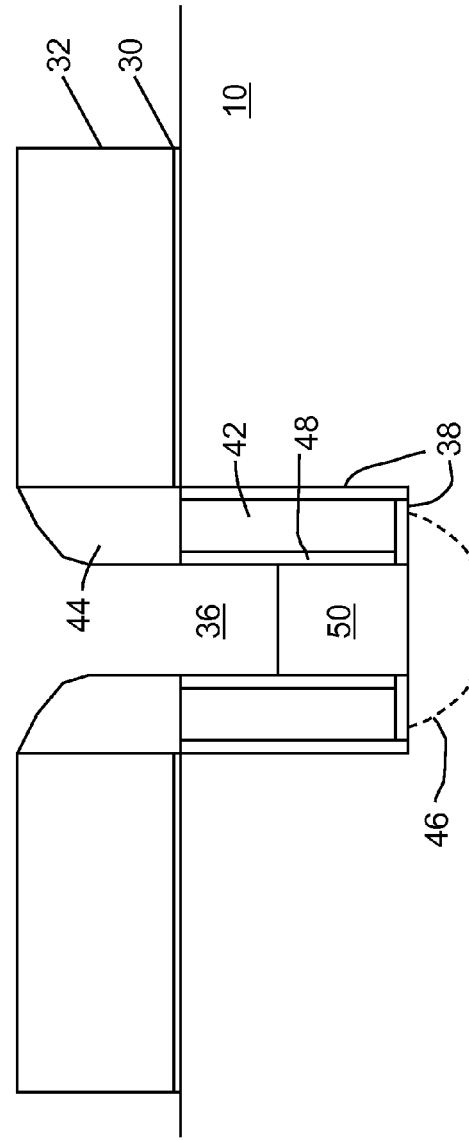

Suitable ion implantation that, depending upon if the substrate is P or N type, may include arsenic, phosphorous, boron and/or antimony (and possible anneal), is then made across the surface of the structure to form first (source) regions 46 in the substrate portions at the bottom of second trenches 36. The source regions 46 are self-aligned to the second trenches 36, and have a second conductivity type (e.g. N type) that is different from a first conductivity type of the substrate (e.g. P type). A layer of oxide 48 is then deposited over the structure, followed by an anisotropic oxide etch that removes oxide layer 48 except for the sidewalls of poly blocks 42. The substrate 10 is also left exposed at the bottom center of second trenches 36. A thick poly layer is then formed over the structure, followed by a CMP poly etch (using nitride layer 32 as the etch stop), and then a poly etch back process, which removes that poly layer except for poly blocks 50 at the bottom of second trenches 36. The resulting structure is shown in FIG. 2D.

Figure 2E:
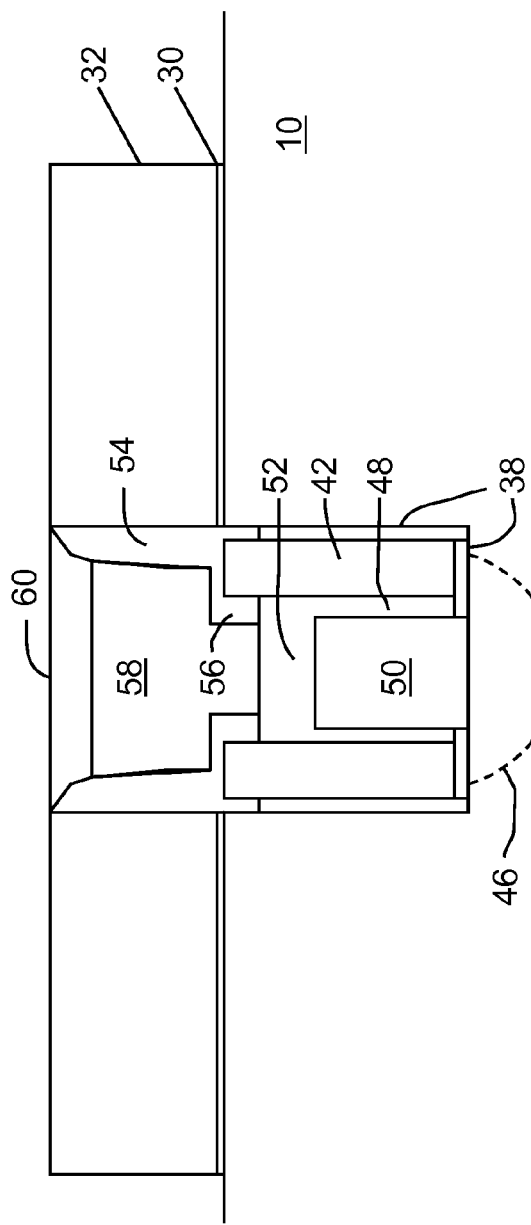

An oxide deposition, followed by a CMP oxide etch (using nitride layer 32 as the etch stop), fills the upper portions of second trenches 36 with oxide 52. An oxide etch is then used to remove the upper portions of oxide 52 (so that the upper surface thereof is below the substrate surface). This oxide etch also removes oxide spacers 44, as well as oxide layers 38 and 48 that surround the upper portions of poly blocks 42. Another oxide deposition, followed by an anisotropic oxide etch, is used to form oxide spacers 54 along the sidewalls of second trenches 36 (and over portions of the tops of poly blocks 42). An oxidation process follows (such as thermal oxidation) to form oxide layer 56 along the exposed portions of poly blocks 42. A poly layer is deposited over the structure, followed by a poly etch process, to form poly blocks 58 inside second trenches 36. Preferably the top surface of poly blocks 58 are recessed from the top of the second trenches 36. An oxide deposition followed by CMP oxide etch is used to form an oxide layer 60 over poly blocks 58. Alternately, a thermal oxidation process can be used to form oxide layer 60. The resulting structure is shown in FIG. 2E.

A nitride etch is then used to remove nitride layer 32. A P-Type ion implantation is used to form the control (or WL) transistor for the memory cell. Oxide layer 30 is removed using an oxide etch, followed by a thermal oxidation to form a gate oxide layer 31 on the exposed portions of substrate 10 (to a thickness of 15 Å/70 Å). A thick poly layer is deposited over the structure, followed by an anisotropic poly etch to remove the deposited polysilicon except for poly spacers 62 against the outer sides of oxide spacers 54. An oxide etch is then used to remove oxide layer 60, the tops of oxide spacers 54, and the exposed portions of oxide layer 31. An oxide deposition and anisotropic etch are used to form oxide spacers 64 on the outer sides of poly spacers 62. Suitable ion implantation (and anneal) is used to form second (drain) regions 66 in the substrate.

Insulation material 68, such as BPSG or oxide, is then formed over the entire structure. A masking step is performed to define etching areas over the drain regions 66. The insulation material 68 is selectively etched in the masked regions to create contact openings that extend down to drain regions 66. The contact openings are then filled with a conductor metal (e.g. tungsten) to form metal contacts 70 that are electrically connected to drain regions 66. The final active region memory cell structure is illustrated in FIG. 2F.

Figure 2F:
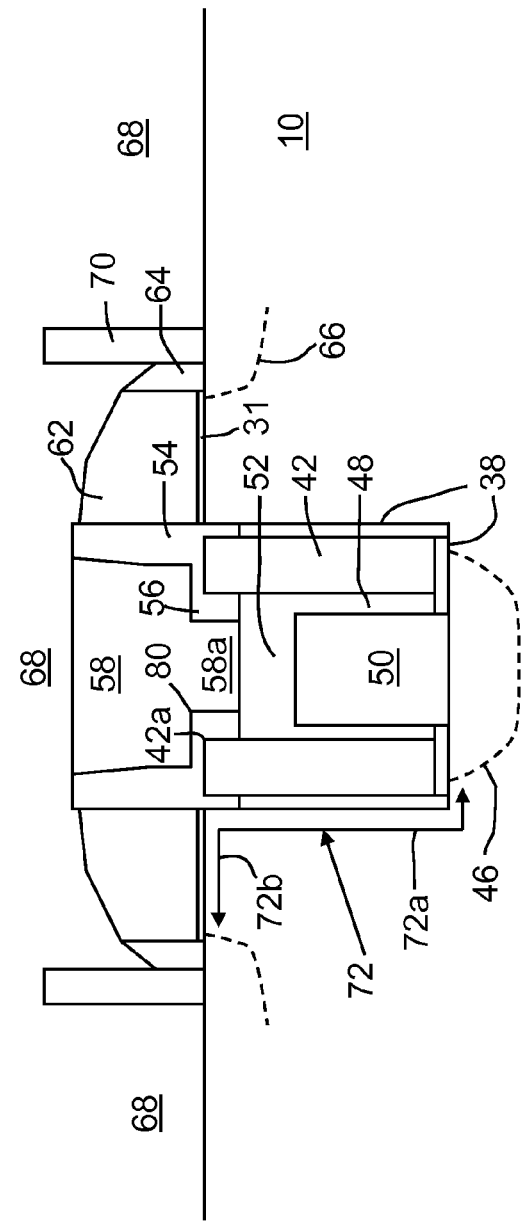

As shown in FIG. 2F, the process of the present invention forms pairs of memory cells that mirror each other, with a memory cell formed on each side of the poly block 50. For each memory cell, first and second regions 46/66 form the source and drain regions respectively (although those skilled in the art know that source and drain can be switched during operation). Poly block 42 constitutes the floating gate, poly spacer 62 constitutes the control gate, and poly block 58 constitutes the erase gate. Channel regions 72 for each memory cell are defined in the surface portion of the substrate that is in-between the source and drain 46/66. Each channel region 72 includes two portions joined together at an approximate right angle, with a first (vertical) portion 72a extending along the vertical wall of filled second trench 36 and a second (horizontal) portion 72b extending between the sidewall of filled second trench 36 and the drain region 66. Each pair of memory cells share a common source region 46 that is disposed under filled second trench 36 and is in electrical contact with poly block 50. Similarly, each drain region 66 is shared between adjacent memory cells from different mirror sets of memory cells.

In the array of the memory cells shown in FIG. 2F, control gates 62 are continuously formed as control (word) lines that extend across both the active and isolation regions 22/24. The above-described process does not produce source regions 46 that extend across the isolation regions 24 (which can easily be done by a deep implant, or by removing the STI insulation material from the isolation region portions of second trenches 36 before ion implantation). However, poly blocks 50 (which are in electrical contact with source regions 46) are formed continuously across the isolation regions to adjacent active regions, and form source lines each of which electrically connects together all the source regions 46 for each row of paired memory cells.

The floating gates 42 are disposed in second trenches 36, with each floating gate facing and insulated from one of the channel region vertical portions 72a, one of the source regions 46 and one of the poly blocks 50. Each floating gate 42 includes an upper portions that has a corner edge 42a that faces (and is insulated from) erase gate 56, thus providing a path for Fowler-Nordheim tunneling through oxide layer 56 to erase gate 58. Poly blocks 50 each extend along and are insulated (by oxide layer 48) from floating gates 42, for enhanced voltage coupling therebetween.

Figure 3:
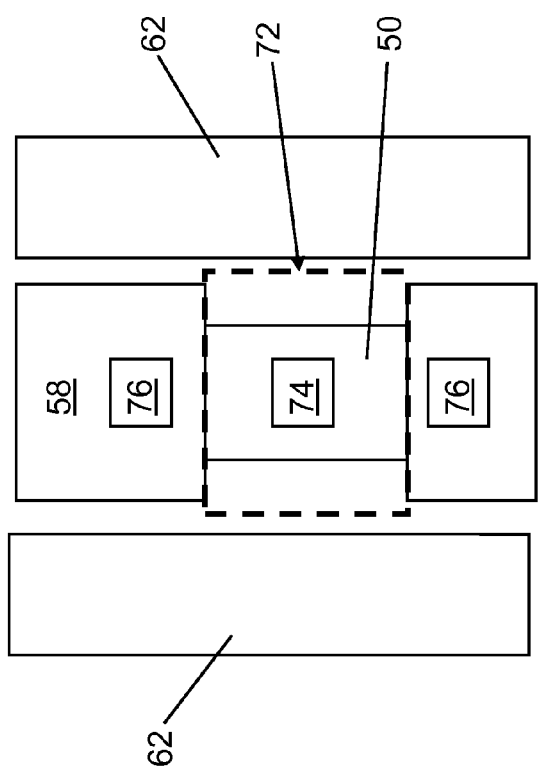
FIG. 3 is a top plan view of a strap region of the memory cell array of the present invention.
Figure 4:
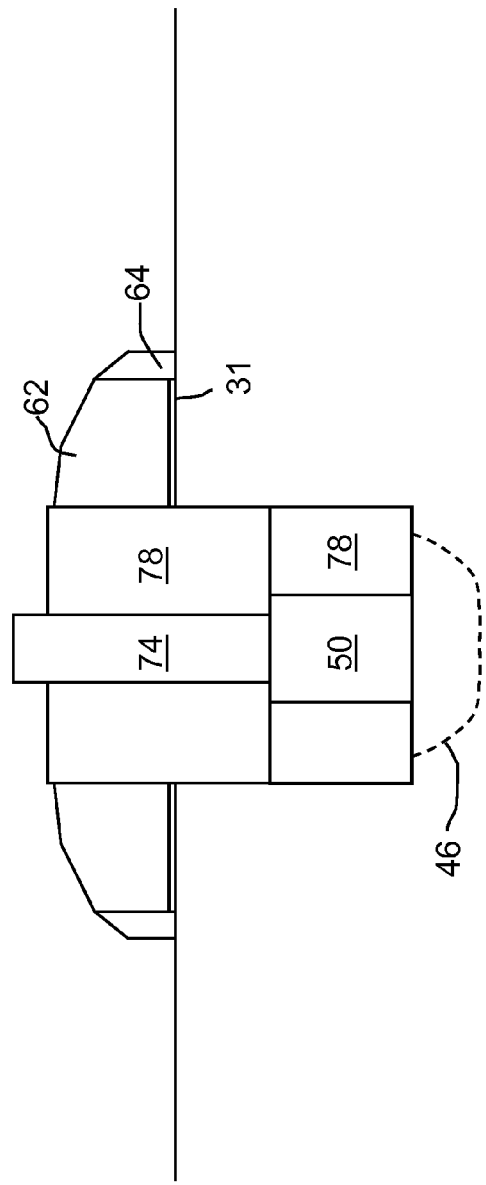
FIG. 4 is a cross sectional view of the strap region of the memory cell array of the present invention.

FIGS. 3 and 4 show top and cross sectional views of the strap regions 72 of the memory array. Strap regions 72 are formed to provide electrical connections to cell elements, such as the source lines 50. In fact, in order to ensure an equalized voltage on any such elements that extend across the array for all the memory cells in the target row/column, strap regions 72 are preferably used to provide multiple electrical connections along the length of continuously formed memory cell elements, so that uniform voltages are applied to all the memory cells in the affected row/column. Strap regions 72 are interlaced between the sets of active/isolation regions. In the preferred embodiment, a strap region column is formed between every set of 128 or 256 active and isolation regions 17/16. In strap region 72, masking and lithography etch processes are used to remove the erase gate 58 from the region and expose source line 50, and to form an electrical contact 74 that extends down to and makes electrical contact with source line 50. Contact 74, which supplies voltage to the source line 50, is separate from other electrical contacts 76 going to the erase gates 58, and is insulated from other components by an insulation material such as oxide 78.

Memory Cell Operation

The operation of the memory cells will now be described. The operation and the theory of operation of such memory cells are also described in U.S. Pat. No. 5,572,054, whose disclosure is incorporated herein by reference with regard to the operation and theory of operation of a non-volatile memory cell having a floating gate, gate to gate tunneling, and an array of memory cells formed thereby.

To erase a selected memory cell in any given active region 22, a ground potential is applied to both its source line (source block 50 and source region 46) and its word line (control gate 62). A high-positive voltage (e.g. +11.5 volts) is applied to its erase gate 58. Electrons on the floating gate 42 are induced through the Fowler-Nordheim tunneling mechanism to tunnel from the corner edge 42a of floating gate 42, through the oxide layer 56, and onto the erase gate 58, leaving the floating gate 42 positively charged. Tunneling is enhanced by the sharpness of corner edge 42a, and the fact that edge 42a faces a notch 80 formed in the erase gate 58. The notch 80 results from the erase gate 58 having a lower portion 58a that is narrower in width and that extends into the top portion of second trench 36 so as to wrap around corner edge 42a. It should be noted that since each erase gate 58 faces a pair of floating gates 42, both floating gates 42 in each pair will be erased at the same time.

When a selected memory cell is desired to be programmed, a small voltage (e.g. 0.5 to 2.0 V) is applied to its drain region 66. A positive voltage level in the vicinity of the threshold voltage of the MOS structure (on the order of approximately +0.2 to 1 volt above the drain 66, such as 1 V) is applied to its control gate 62. A positive high voltage (e.g. on the order of 5 to 10 volts, such as 6 V) is applied to its source region 46 (and source block 50). Because the floating gate 42 is highly capacitively coupled to the poly block 50, which is at the same voltage potential as the source region 46, the floating gate 42 "sees" a voltage potential of on the order of +4 to +8 volts. Electrons generated by the drain region 66 will flow from that region towards the source region 46 through the deeply depleted horizontal portion 72b of the channel region 72. As the electrons reach the vertical portion 72a of the channel region 72, they will see the high potential of floating gate 42 (because the floating gate 42 is strongly voltage-coupled to the positively charged source region 46 and poly block 50). The electrons will accelerate and become heated, with most of them being injected into and through the insulating layer (under oxide spacer 54) and onto the floating gate 42, thus negatively charging the floating gate 42. Low or ground potential is applied to the source/drain regions 46/66 and control gates 62 for memory cell rows/columns not containing the selected memory cell. Thus, only the memory cell in the selected row and column is programmed.

The injection of electrons onto the floating gate 42 will continue until the reduction of the charge on the floating gate 42 can no longer sustain a high surface potential along the vertical channel region portion 72a to generate hot electrons. At that point, the electrons or the negative charges in the floating gate 42 will decrease the electron flow from the drain region 66 onto the floating gate 42.

Finally, to read a selected memory cell, ground potential is applied to its source region 46. A read voltage (e.g. ~0.6 to 1 volt) is applied to its drain region 66, and a Vcc voltage of approximately 1 to 4 volts (depending upon the power supply voltage of the device) is applied to its control gate 62. If the floating gate 42 is positively charged (i.e. the floating gate is discharged of electrons), then the vertical channel region portion 72a (adjacent to the floating gate 42) is turned on. When the control gate 62 is raised to the read potential, the horizontal channel region portion 72b (adjacent the control gate 62) is also turned on. Thus, the entire channel region 72 will be turned on, causing electrons to flow from the source region 46 to the drain region 66. This sensed electrical current would be the "1" state.

On the other hand, if the floating gate 42 is negatively charged, the vertical channel region portion 72a is either weakly turned on or is entirely shut off. Even when the control gate 62 and the drain region 66 are raised to their read potentials, little or no current will flow through vertical channel region portion 72a. In this case, either the current is very small compared to that of the "1" state or there is no current at all. In this manner, the memory cell is sensed to be programmed at the "0" state. Ground potential is applied to the source/drain regions 46/66 and control gates 62 for non-selected columns and rows so only the selected memory cell is read.

The memory cell array includes peripheral circuitry including conventional row address decoding circuitry, column address decoding circuitry, sense amplifier circuitry, output buffer circuitry and input buffer circuitry, which are well known in the art.

The present invention provides a memory cell array with reduced size and superior program, read and erase efficiencies. Memory cell size is reduced significantly because the source regions 46 are buried inside the substrate 10, and are self-aligned to the second trenches 36, where space is not wasted due to limitations in the lithography generation, contact alignment and contact integrity. Each floating gate 42 has a lower portion disposed in second trench 36 formed in the substrate for receiving the tunneling electrons during the program operation and for turning on the vertical channel region portion 72a during the read operation. Each floating gate 42 also has an upper portion terminating in a corner edge 42a facing the notch portion 80 of the erase gate 58 for Fowler Nordheim tunneling thereto during the erase operation. Erase efficiency is enhanced by notch 80 of erase gate 58 that wraps around the corner edge 42a.

Also with the present invention, there is also an enhanced voltage coupling between each floating gate 42 and the corresponding source region 46 via the poly block 50 (electrically connected with the source region 46). At the same time, there is relatively low voltage coupling between the floating gate 42 and the control gate 62. Furthermore, having source region 46 and drain region 66 separated vertically as well as horizontally allows for easier optimization of reliability parameters without affecting cell size. Finally, by providing an erase gate 58 that is separate from the control gate 62, the control gate need only be a low voltage device. This means that high voltage drive circuitry need not be coupled to control gates 62, control gate 62 can be separated further from floating gate 42 for reduced capacitive coupling there between, and that the oxide layer 31 insulating the control gate 62 from the substrate 10 can be thinner given the lack of high voltage operation of the control gate 62.

It is to be understood that the present invention is not limited to the embodiment(s) described above and illustrated herein, but encompasses any and all variations falling within the scope of the appended claims. For example, trenches 20/36 can end up having any shape that extends into the substrate, with sidewalls that are or are not oriented vertically, not just the elongated rectangular shape shown in the figures. Also, although the foregoing method describes the use of appropriately doped polysilicon as the conductive material used to form the memory cells, it should be clear to those having ordinary skill in the art that in the context of this disclosure and the appended claims, "polysilicon" refers to any appropriate conductive material that can be used to form the elements of non-volatile memory cells. In addition, any appropriate insulator can be used in place of silicon dioxide or silicon nitride. Moreover, any appropriate material having etch properties that differ from that of silicon dioxide (or any insulator) and from polysilicon (or any conductor) can be used. Further, as is apparent from the claims, not all method steps need be performed in the exact order illustrated or claimed, but rather in any order that allows the proper formation of the memory cell of the present invention. Additionally, the above described invention is shown to be formed in a substrate which is shown to be uniformly doped, but it is well known and contemplated by the present invention that memory cell elements can be formed in well regions of the substrate, which are regions that are doped to have a different conductivity type compared to other portions of the substrate. Single layers of insulating or conductive material could be formed as multiple layers of such materials, and vice versa. The top surfaces of floating gates 42 may extend above, or can be recessed below, the substrate surface. Lastly, while notches 90 surrounding floating gate edges 42a are preferable, they are not necessarily mandatory, as it is possible to implement erase gate 58 without notches 80 (e.g. where the lower portion of erase gate 58 is simply laterally adjacent to or vertically adjacent to (and insulated from) floating gate 42.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. An electrically programmable and erasable memory device comprising:
    a substrate of semiconductor material having a first conductivity type and a surface;
    a trench formed into the surface of the substrate;
    first and second spaced-apart regions formed in the substrate and having a second conductivity type, with a channel region in the substrate there between, wherein the first region is formed under the trench, and the channel region includes a first portion that extends substantially along a sidewall of the trench and a second portion that extends substantially along the surface of the substrate;
    an electrically conductive floating gate at least partially disposed in the trench adjacent to and insulated from the channel region first portion for controlling a conductivity of the channel region first portion;
    an electrically conductive control gate disposed over and insulated from the channel region second portion for controlling a conductivity of the channel region second portion;
    an electrically conductive erase gate disposed adjacent to and insulated from the floating gate; and
    a block of conductive material having at least a lower portion thereof disposed in the trench that is electrically connected to the first region and is adjacent to and insulated from the floating gate.

2. The device of claim 1, wherein there is no vertical overlap between the control gate and the floating gate.

3. The device of claim 1, wherein the erase gate is disposed adjacent to the floating gate and insulated there from with insulation material having a thickness that permits Fowler-Nordheim tunneling.

4. The device of claim 1, wherein the erase gate includes a notch and the floating gate includes an edge that directly faces and is insulated from the notch.

5. The device of claim 4, wherein the erase gate includes an upper portion having a first width and lower portion having a second width less than the first width.

6. The device of claim 5, wherein the notch is formed where the first and second portions of the erase gate meet.

7. The device of claim 5, wherein the erase gate lower portion at least partially extends into the trench.

8. The device of claim 4, further comprising:
- a third region formed in the substrate and having a second conductivity type, with a second channel region in the substrate between the first and third regions, wherein the second channel region includes a first portion that extends substantially along a sidewall of the trench and a second portion that extends substantially along the surface of the substrate;
- a second electrically conductive floating gate at least partially disposed in the trench adjacent to and insulated from the second channel region first portion for controlling a conductivity of the second channel region first portion; and
- an electrically conductive control gate disposed over and insulated from the second channel region second portion for controlling a conductivity of the second channel region second portion;
- wherein the erase gate includes a second notch and the second floating gate includes an edge that directly faces and is insulated from the second notch.

* * * * *